(12) United States Patent
Featherstone, III

(10) Patent No.: US 6,351,385 B1
(45) Date of Patent: Feb. 26, 2002

(54) HEAT SINK FOR INTEGRATED CIRCUIT PACKAGES

(75) Inventor: Raymond McKay Featherstone, III, Indianapolis, IN (US)

(73) Assignee: Thomson Licensing, S.A., Boulogne (FR)

( * ) Notice: Subject to any disclaimer, the term of this patent is extended or adjusted under 35 U.S.C. 154(b) by 0 days.

(21) Appl. No.: 09/669,650

(22) Filed: Sep. 26, 2000

(51) Int. Cl.[7] ................................................. H05K 7/20
(52) U.S. Cl. ...................... 361/704; 361/707; 361/712; 361/719; 257/706; 257/707; 174/16.3; 165/185
(58) Field of Search ................................ 361/688, 690, 361/702–704, 707, 709, 712, 717–721; 257/706, 719, 721; 174/15.1, 16.1, 16.3; 165/80.1, 80.2, 80.3, 185

(56) References Cited

U.S. PATENT DOCUMENTS

| | | | | |
|---|---|---|---|---|
| 4,209,798 A | * | 6/1980 | Beretta | 257/666 |
| 4,254,447 A | * | 3/1981 | Griffis | 361/719 |
| 4,574,330 A | * | 3/1986 | Cohen et al. | 361/681 |
| 4,695,924 A | * | 9/1987 | Wozniczka | 361/720 |
| 6,008,987 A | * | 12/1999 | Gale et al. | 361/700 |
| 6,067,231 A | * | 5/2000 | Lu | 361/704 |

\* cited by examiner

*Primary Examiner*—Gerald Tolin
*Assistant Examiner*—Boris L. Chervinsky
(74) *Attorney, Agent, or Firm*—Joseph S. Tripoli; Robert D. Shedd; Frederick A. Wein

(57) ABSTRACT

An integrated circuit heat dissipator is comprised of a unitary piece of metallic material for dissipating thermal energy generated by semiconductor devices encapsulated in a DIP integrated circuit package. The heat dissipator is adapted to accept heat conducting pins of the integrated circuit. Soldering secures the heat dissipator and the integrated circuit heat conducting pins to each other and to the printed circuit board. A bulk mass of heat conducting solder is retained at the connection of the heat dissipator and the heat conducting pins for enhancing the heat sinking of the pins by the heat dissipator.

6 Claims, 2 Drawing Sheets

HEAT SINK FOR INTEGRATED CIRCUIT PACKAGES

TECHNICAL FIELD

The present invention relates to apparatus for the dissipation of thermal energy generated by semiconductor devices, and more particularly, it relates to heat dissipator apparatus designed to connect directly to semiconductor package structures in order to maximize heat transfer to the surrounding environment.

BACKGROUND

Many semiconductor devices generate heat during operation which must be dissipated. In many devices the heat generated is sufficiently self dissipated by the package and the leads. The goal of attaching a heat dissipator or heat sink to an electronics package when self heat dissipation is not enough, is to keep the semiconductor junction temperatures within that package low enough to assure reliability. In general, this is accomplished by attaching a heat sink as thermally close to the chip (or junction) of the device as possible. Such heat sinks can be mounted to a device package and comprise a bulk mass of thermally conductive material such as copper, aluminum or the like, with a large surface area which dissipates the heat into the surrounding environment. Such heat sinks can be extruded or made of stamped sheet metal, and can include heat dissipating fins or wings for extra heat dissipation surface area.

Many heat generating integrated circuit (IC) packages are provided with a metal tab or slug which is thermally coupled to the junctions, extends outwardly from the encapsulation body, and provides the main path for heat flow out of the device to the attached heat sink. One can attach the heat sink, via a clip or screw, directly to this metal slug, or through an insulating wafer using a heat conductive dielectric compound if electrical isolation is required.

Integrated circuits are produced in a variety of protective packages. A common package is the dual-in-line package, or DIP, in which the integrated circuit chip is encapsulated in a sealed rectangular plastic body of dielectric material. DIPs however, are difficult to heat sink because often there is no metal slug/tab to which one can attach a heat sink. Most often the heat generated in a DIP leaves the package by conduction through the leads with some heat dissipating by radiation and convection from the body. That the entire package is encapsulated in plastic, makes the body of the package an inefficient place to attach a heat sink, although this can be done.

A plurality of solderable metallic terminals, called pins or leads, are located at the long sides of the DIP package. In the high powered DIP package of the exemplary embodiment, the plurality of the pins on one side are electrically connected to the integrated circuit chip inside the body, thereby permitting electrical connections to be made to the chip circuit. The plurality of pins on the other side of the body are in direct physical contact with a metallic ground plane on the bottom of the chip, and heat conducting leads are used to conduct heat from the chip to the external environment. A heat dissipator can be attached, i.e., soldered, to the heat-conducting pins and thereby further aid in the conduction of heat away from the integrated circuit chip, such as in U.S. Pat. No. 4,254,447 of Griffis. In the prior art, heat sinking has been done by soldering the heat conducting leads to a ground plane formed from copper foil on one or both sides of the printed circuit board (PCB), as shown in FIGS. 1 and 2 and discussed more fully below. Further, a unitary heat sink has been soldered to the PCB copper foil ground plane proximal to the IC, as shown in FIG. 3, also discussed more fully below. For the latter arrangement, heat would flow through the heat conducting leads, through the first solder junction between the leads and the copper foil, the copper foil, a second solder junction from the copper foil to the heat sink, and into the heat sink. This long path and plurality of junctions with each junction having a thermal resistance, can result in higher temperatures.

When a heat sink is used, it is desirable to use a heat dissipator that is economical to manufacture, easily mounted in conjunction with the IC package, and maximizes the quantity of heat dissipated.

SUMMARY OF THE INVENTION

It is desirable that a heat sink should be attached as thermally close to the semiconductor chip as practicable to make an efficient path for the heat to flow to the heat sink. The present invention provides such an efficient means of connecting the heat conducting leads of a DIP package to a heat sink. With the present heat sink design, the heat conducting leads of the device are inserted into receiving apertures in the heat sink. The receiving apertures are in register with the heat conducting pins, i.e., being of the right spacing and size, and are disposed in a "U" shaped contoured portion which doubles back on itself, forming a channel or reservoir.

During assembly, the contoured part of the heat sink is mounted onto the PCB, protruding below the board surface, and the integrated circuit device is installed on the PCB with the heat conducting pins installed into respective apertures in the heat sink channel. The leads, PCB, and contoured portion of the heat sink are then soldered together.

Because the heat sink is soldered directly to the heat sinking leads, the heat sink provides maximal thermal conduction from the semiconductor device by reducing the path length of heat conduction between the device and the heat sink. This is enhanced by the leads each being soldered in their own apertures which are spaced apart, thus distributing the heat flowing to the heat sink.

Additionally, the heat sink channel forms a collector or catch basin for the accumulation and retention of solder when the assembly and PCB are soldered. This added bulk mass of heat conducting solder remaining in the channel in intimate contact with the heat conducting leads further enhances the flow of heat out from the IC chip.

DESCRIPTION OF THE PREFERRED EMBODIMENT(S)

As used herein, "unitary" means a singular device in accordance with its dictionary meaning, as opposed to the copper foil of a printed circuit board, which although it does conduct heat from components mounted on the printed circuit board, the copper foil is inseparable from the printed circuit board and is not "unitary". Also as used herein, "heat conducting pins" or "heat conducting leads" means pins or leads which extend from a semiconductor package and have the designated function of providing heat sinking of the device.

Figure 1:
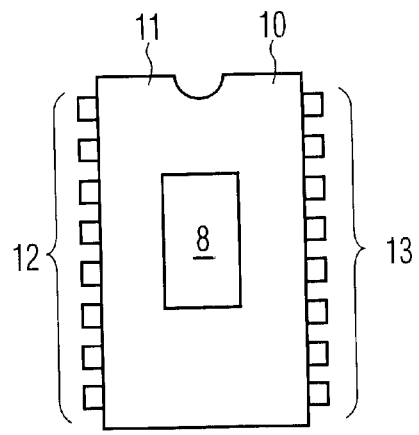
FIG. 1 is a top view representation of a DIP packaged integrated circuit showing its pin arrangement with the pins depending downward.

FIG. 1 shows an exemplary DIP packaged integrated circuit 10 wherein the integrated circuit chip 8 is encapsulated within a rectangular body of dielectric material 11. Extending from each of the long sides of the body 11 are a plurality of respective leads 12, 13. Leads 12 on one of the long sides of body 11 are internally connected to the integrated circuit chip and provide means for connecting power and signal/data paths to the chip. Leads 13 extend from the other long side of body 11. For the exemplary TDA7268 DIP integrated circuit made by SGS-Thomson Microelectronics of Italy, the row of leads 13 are connected to ground inside the chip and serve as heat conductors to conduct the heat generated within the DIP package to the outside of the body 11 for dissipation to the surrounding environment.

Figure 2:
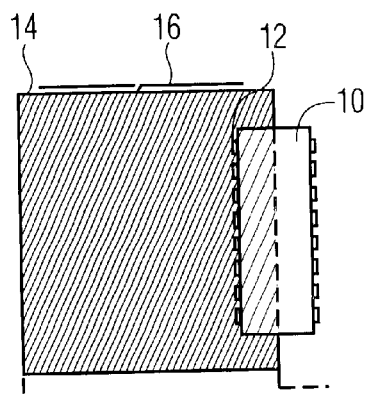
FIG. 2 is a representation of a prior art heat sink arrangement for a DIP packaged integrated circuit.

FIG. 2 shows a manufacturer recommended heat sinking arrangement for the exemplary DIP integrated circuit. The DIP package 11 is mounted to printed circuit board 16 wherein heat sinking row of pins 13 are soldered to an area of copper foil 14 so that the thin foil 14 will draw heat from integrated circuit 10 through the row of pins 13 to dissipate the heat to the environment. In this case, one must be careful that the total length of the plural solder joints of the PCB is not so long as to cause a thermal mismatch between the solder and the thermal expansion of the board, and cause the solder to crack.

Figure 3:
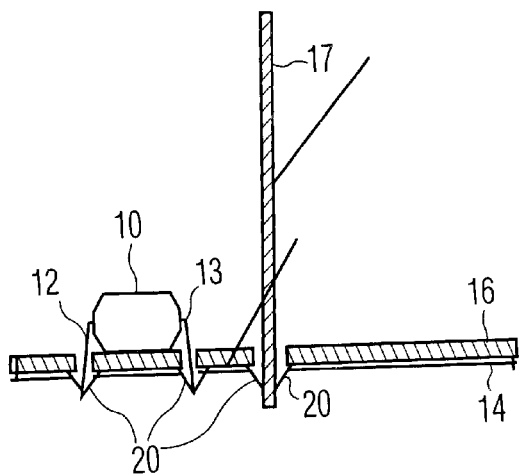
FIG. 3 is a cut-away view representation of a prior art heat dissipator arrangement including a DIP packaged IC, a unitary heat sink, and a PCB.

FIG. 3 shows a prior art arrangement wherein DIP package 10 of FIG. 1 is mounted on PCB 16 with the electronic leads 12 soldered to appropriate separate apertures in the board and the row of heat conducting leads 13 are soldered to copper foil 14 at solder joints 20. Unitary heat dissipator 18 is mounted on the board in close thermal proximity to DIP IC 10 by solder joints 20 for providing additional heat sinking for IC 10.

Figure 4:
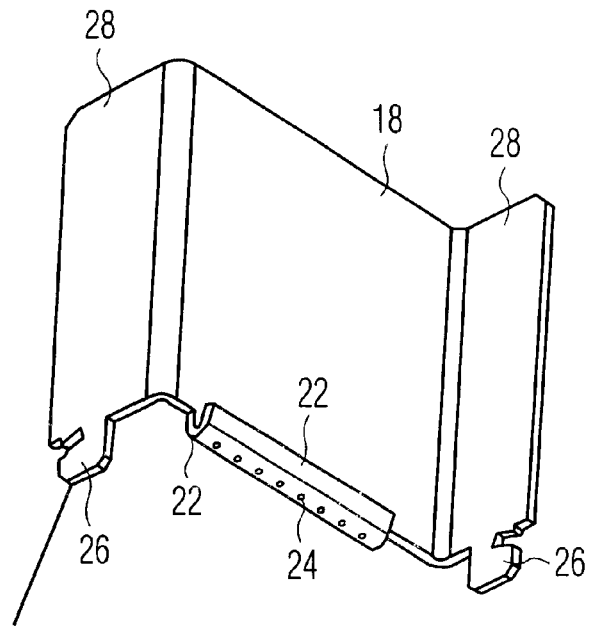
FIG. 4 is a perspective bottom view of a heat dissipator in accordance with aspects of the present invention.

FIG. 4, shows a unitary heat dissipator 18 comprised of a single piece of heat conducting metallic material, i.e., plated steel, copper, or other solderable material. Heat dissipator 18 is provided with a "U" shaped contoured channel at the lower end and has apertures therein which are in registry with the row of pins 13 so as to have the correct spacing and size for receiving respective leads 13 therein. Contoured portion 22 will extend below the lower surface of PCB 16 when mounted to board 16 by tabs 26 which, in the exemplary embodiment, are provided on wings 28, for providing an increased heat dissipating area exposed to the surrounding environment to further aid in the dissipation of thermal energy.

Figure 5:
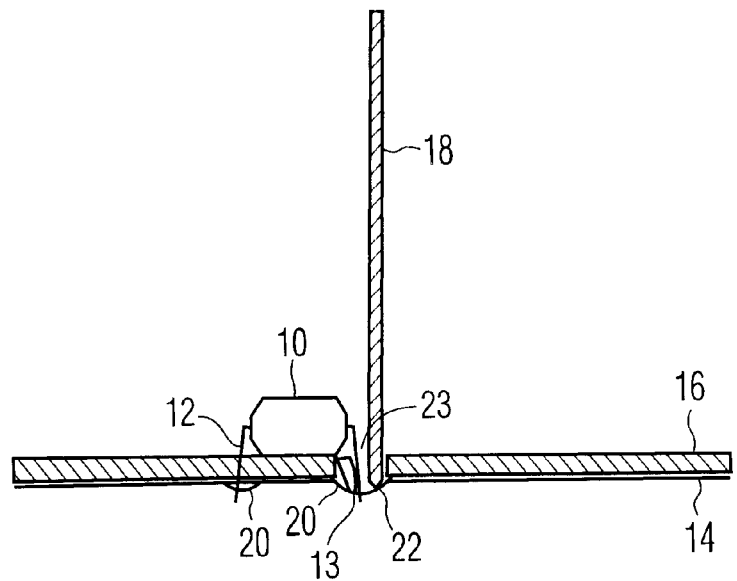
FIG. 5 is a cut-away representation of the heat dissipator of FIG. 4 in operative engagement with the DIP packaged IC heat conducting leads and a printed circuit board, according to aspects of the present invention.

Referring now to FIG. 5, heat dissipator 18 is mounted proximal to DIP IC 10 with contoured portion 22 extending below the PCB lower surface. DIP IC 10 is installed on the PCB with heat conducting pins 13 installed in respective spaced apart apertures of channel 22. Heat dissipator 18 is held in place by tabs 26 and in contact with leads 13 prior to soldering. Both heat sink channel 22 and device leads 13 being below the bottom side of the PCB, will come into contact with solder and be soldered by a typical solder pot or wave-solder machine. In this manner heat conducting leads 13 and the heat sink 18 are soldered directly together in an intimate thermal connection.

Additionally, the U-shaped contoured channel 22 forms a collector or catch basin 23 for accumulation and retention of solder 24 when PCB 16 is soldered. This added bulk mass in intimate contact with heat conducting leads 13 improves the conduction of heat out from the chip. This is because the equation for conduction heat transfer is $q_x=(kA)(dT/dx)$ where k is the coefficient of thermal conductivity of the material, A is the cross-sectional area of the part, and $dT/dx$ is the change in temperature along the path. In this instance, the retained solder in channel 22 increases the cross-sectional area A, thus increasing the heat transfer $q_x$. This firm and broad thermal contact ensures efficient heat conductivity between heat conducting pins 13, heat dissipator 18, retained solder 24, U-shaped contoured channel 22, and copper foil 14 of PCB 16.

It will be noted that the heat sink dissipator 18 is of unitary design which can be formed by simple stamping operations. The efficiency of the heat sink will be partially dependent, of course, upon the type of material used, the size, thickness and configuration of the heat dissipator body, the surrounding environment, and the quality of the junction between the heat dissipator 18 and heat conducting leads 13.

What is claimed is:

1. A heat sink apparatus comprising:
   a heat dissipator consisting of a unitary thermally conductive material having a plurality of apertures lying in register with and for receiving a plurality of heat conducting pins of a semiconductor encapsulated device, for conducting and dissipating heat from the semiconductor device to the surrounding environment and wherein:
   said heat conducting pins are soldered directly to said heat dissipator at the location of said apertures and are soldered also to a foil side of a printed circuit board; and
   said apertures being located on a U-shaped contoured channel portion of said heat dissipator forming a catch basin for accumulation and retention of solder.

2. In combination, a semiconductor encapsulated device having a central body and a plurality of heat conducting pins extending from said central body, and a heat dissipator comprising a unitary thermally conductive material having apertures lying in register with and for receiving the heat conducting pins of the semiconductor device, said dissipator being in intimate contact with said thermal conducting pins for conducting and dissipating heat from the semiconductor device to the surrounding environment and wherein:
   said heat conducting pins are soldered directly to said heat dissipator at the location of said apertures and are soldered also to a foil side of a printed circuit board; and
   said apertures are located on a U-shaped contoured channel portion of said heat dissipator forming a catch basin for accumulation and retention of solder.

3. In combination, a thermally protected integrated circuit chip and printed circuit board comprising:
   a printed circuit board;
   an integrated circuit package enclosing an integrated circuit chip, said package being mounted on said printed circuit board and having heat conductive pins extending from said package; and
   a unitary heat dissipator having apertures lying in register with and for receiving the heat conducting pins, the heat dissipator being in intimate contact with said thermal conducting pins for conducting and dissipating heat to the surrounding environment and wherein:

said heat conducting pins are soldered directly to said unitary heat dissipator at the location of said apertures and are soldered also to a foil side of said printed circuit board; and said apertures are located on a U-shaped contoured channel portion of said heat dissipator forming a catch basin in which solder is accumulated and retained.

4. The arrangement of claim 3, wherein said integrated circuit package comprises a rectangular molded body having a plurality of leads and said heat conducting pins extend from the body, and bent so as to be suitable for insertion in the apertures of the heat dissipator.

5. In combination, a thermally protected integrated circuit chip assembly comprising:

a printed circuit board;

an integrated circuit package enclosing an integrated circuit chip, mounted on said printed circuit board, and including heat conductive pins extending from said package;

a unitary heat dissipator mounted on said printed circuit board adjacent to said integrated circuit package, the heat dissipator having apertures lying in register with and for receiving the heat conducting pins of the semiconductor device, and in intimate contact with said heat conducting pins for conducting and dissipating heat into the surrounding environment and wherein:

said heat conducting pins are soldered directly to said unitary heat dissipator at the location of said apertures and are soldered also to a foil side of said printed circuit board; and said apertures are located on a U-shaped channel portion of said unitary heat dissipator forming a catch basin in which solder is accumulated and retained.

6. An apparatus comprising:

a heat dissipator comprising a unitary thermally conductive material having a plurality of apertures lying in register with and for receiving a plurality of heat conducting pins of a semiconductor encapsulated device, the apertures lying in a U-shaped contoured reservoir portion for receiving and holding solder and wherein:

said heat conducting pins are soldered directly to said unitary heat dissipator at the location of said apertures and are soldered also to a foil side of a printed circuit board; and said U-shaped contoured reservoir portion of said unitary heat dissipator forming a catch basin wherein a quantity of said solder is retained in the connection of the heat conducting pins and the heat dissipator to help conduct heat from the heat conducting pins.

* * * * *